US009117991B1

(12) United States Patent
Olson et al.

(10) Patent No.: US 9,117,991 B1
(45) Date of Patent: Aug. 25, 2015

(54) USE OF FLEXIBLE CIRCUITS INCORPORATING A HEAT SPREADING LAYER AND THE RIGIDIZING SPECIFIC AREAS WITHIN SUCH A CONSTRUCTION BY CREATING STIFFENING STRUCTURES WITHIN SAID CIRCUITS BY EITHER FOLDING, BENDING, FORMING OR COMBINATIONS THEREOF

(71) Applicant: FLEXTRONICS AP LLC, Broomfield, CO (US)

(72) Inventors: Bruce Olson, Northfield, MN (US);
Kevin Buermann, Lakeville, MN (US);
Shaun Sheehan, Farmington Hills, MI (US)

(73) Assignee: Flextronics AP, LLC, Broomfield, CO (US)

( * ) Notice: Subject to any disclaimer, the term of this patent is extended or adjusted under 35 U.S.C. 154(b) by 135 days.

(21) Appl. No.: 13/763,214

(22) Filed: Feb. 8, 2013

Related U.S. Application Data

(60) Provisional application No. 61/597,619, filed on Feb. 10, 2012.

(51) Int. Cl.
*H01L 33/64* (2010.01)
(52) U.S. Cl.
CPC .................................. *H01L 33/642* (2013.01)
(58) Field of Classification Search
CPC ........... H01L 2224/48091; H01L 2224/48247;
H01L 2224/73265; H01L 2224/32245; H01L 2224/16225; H01L 25/0753; H01L 33/62;
H01L 33/64; H01L 33/642; H01L 33/648;
H01L 33/08; H01L 33/382; H01L 33/486;
H01L 33/52; H01L 33/641; H01L 33/647;
H01L 2924/12041; H05B 37/00; H05K 2201/10106; H05K 2201/056; H05K 2201/0355; H05K 2201/055; H05K 2201/0989; H05K 2203/063; H05K 2203/302; H05K 2203/1545; H05K 3/0061; H05K 3/0058; H05K 3/281
USPC .................................................. 313/498–512
See application file for complete search history.

(56) References Cited

U.S. PATENT DOCUMENTS

| 2,911,605 A | 11/1959 | Wales, Jr. |
| 4,051,425 A | 9/1977 | Smith |
| 4,495,546 A | 1/1985 | Nakamura et al. |

(Continued)

FOREIGN PATENT DOCUMENTS

| DE | 102009034841 | 2/2011 | | |
| WO | WO 2008003289 A2 * | 1/2008 | ................ | F21S 4/00 |
| WO | WO 2012104800 A2 * | 8/2012 | ............. | H05B 37/02 |

OTHER PUBLICATIONS

EE Times. com-"Team Claims Midrange Wireless Energy Transfer", by R. Colin Johnson, 4 pages, Nov. 6, 2007.

(Continued)

*Primary Examiner* — Anne Hines
*Assistant Examiner* — Jose M Diaz
(74) *Attorney, Agent, or Firm* — Haverstock & Owens LLP

(57) ABSTRACT

A method of and the device for making a LED assembly that contains regionally rigid structures that are made by bending, folding, or forming a flexible hybrid heat spreading laminate is provided. The hybrid heat spreading laminate comprises a thin heat spreader layer in the range of 100-150 micrometers. The hybrid heat spreading laminate has enhanced heat conductivity and thermal emissivity.

38 Claims, 4 Drawing Sheets

(56) References Cited

U.S. PATENT DOCUMENTS

| | | | |
|---|---|---|---|
| 4,712,160 A | 12/1987 | Sato et al. | |
| 4,729,076 A | 3/1988 | Masami et al. | |
| 4,771,824 A | 9/1988 | Rojey et al. | |
| 4,788,626 A | 11/1988 | Neidig et al. | |
| 4,893,227 A | 1/1990 | Gallios et al. | |
| 4,899,256 A | 2/1990 | Sway-Tin | |
| 4,901,069 A | 2/1990 | Veneruso | |
| 4,975,821 A | 12/1990 | Lethellier | |
| 5,101,322 A | 3/1992 | Ghaem et al. | |
| 5,164,657 A | 11/1992 | Gulczynski | |
| 5,235,491 A | 8/1993 | Weiss | |
| 5,262,932 A | 11/1993 | Stanley et al. | |
| 5,295,044 A | 3/1994 | Araki et al. | |
| 5,490,052 A | 2/1996 | Yoshida et al. | |
| 5,565,761 A | 10/1996 | Hwang | |
| 5,565,781 A | 10/1996 | Dauge | |
| 5,592,128 A | 1/1997 | Hwang | |
| 5,632,551 A | 5/1997 | Roney et al. | |
| 5,712,772 A | 1/1998 | Telefus et al. | |
| 5,742,151 A | 4/1998 | Hwang | |
| 5,747,977 A | 5/1998 | Hwang | |
| 5,798,635 A | 8/1998 | Hwang et al. | |
| 5,804,950 A | 9/1998 | Hwang et al. | |
| 5,811,895 A | 9/1998 | Suzuki et al. | |
| 5,818,207 A | 10/1998 | Hwang | |
| 5,890,794 A | 4/1999 | Abtahi et al. | |
| 5,903,138 A | 5/1999 | Hwang et al. | |
| 5,905,369 A | 5/1999 | Ishii et al. | |
| 5,923,543 A | 7/1999 | Choi | |
| 6,032,698 A * | 3/2000 | Schwert et al. | 138/98 |
| 6,039,600 A | 3/2000 | Etters et al. | |
| 6,058,026 A | 5/2000 | Rozman | |
| 6,069,803 A | 5/2000 | Cross | |
| 6,074,074 A * | 6/2000 | Marcus | 362/240 |
| 6,077,124 A * | 6/2000 | Etters et al. | 439/632 |
| 6,160,725 A | 12/2000 | Jansen | |
| 6,272,015 B1 | 8/2001 | Mangtani | |
| 6,282,092 B1 | 8/2001 | Okamoto et al. | |
| 6,344,980 B1 | 2/2002 | Hwang et al. | |
| 6,358,064 B2 | 3/2002 | Szalay et al. | |
| 6,396,277 B1 | 5/2002 | Fong et al. | |
| 6,407,514 B1 | 6/2002 | Glaser et al. | |
| 6,445,008 B1 * | 9/2002 | Lin et al. | 257/82 |
| 6,469,914 B1 | 10/2002 | Hwang et al. | |
| 6,469,980 B1 | 10/2002 | Takemura et al. | |
| 6,483,281 B2 | 11/2002 | Hwang | |
| 6,531,854 B2 | 3/2003 | Hwang | |
| 6,541,944 B2 | 4/2003 | Hwang | |
| 6,578,253 B1 | 6/2003 | Herbert | |
| 6,605,930 B2 | 8/2003 | Hwang | |
| 6,657,417 B1 | 12/2003 | Hwang | |
| 6,671,189 B2 | 12/2003 | Jansen et al. | |
| 6,674,272 B2 | 1/2004 | Hwang | |
| 6,958,920 B2 | 10/2005 | Mednik et al. | |
| 7,047,059 B2 | 5/2006 | Avrin et al. | |
| 7,210,832 B2 | 5/2007 | Huang | |
| 7,259,403 B2 | 8/2007 | Shimizu et al. | |
| 7,286,376 B2 | 10/2007 | Yang | |
| 7,439,962 B2 | 10/2008 | Reynolds et al. | |
| 7,549,786 B2 * | 6/2009 | Higley et al. | 362/646 |
| 7,611,261 B2 | 11/2009 | Richmond et al. | |
| 8,227,269 B2 | 7/2012 | Chen et al. | |
| 8,342,734 B2 * | 1/2013 | Ohmi et al. | 362/657 |
| 8,378,559 B2 | 2/2013 | Shuja et al. | |
| D687,179 S | 7/2013 | Kim | |
| 8,591,051 B2 | 11/2013 | Nakajima et al. | |
| 8,661,660 B2 | 3/2014 | Ter-Hovhannissian | |
| 8,761,565 B1 * | 6/2014 | Coleman et al. | 385/146 |
| 2001/0042865 A1 | 11/2001 | Oshio et al. | |
| 2002/0011823 A1 | 1/2002 | Lee | |
| 2003/0035303 A1 | 2/2003 | Balakrishnan et al. | |
| 2004/0228153 A1 | 11/2004 | Cao et al. | |
| 2005/0104059 A1 * | 5/2005 | Friedman et al. | 257/40 |
| 2005/0105224 A1 | 5/2005 | Nishi | |
| 2005/0146886 A1 * | 7/2005 | Furuya et al. | 362/494 |
| 2005/0281425 A1 | 12/2005 | Greuet et al. | |
| 2006/0090787 A1 * | 5/2006 | Onvural | 136/212 |
| 2006/0186430 A1 | 8/2006 | Park et al. | |
| 2007/0025108 A1 * | 2/2007 | Kingsford et al. | 362/294 |
| 2007/0028626 A1 | 2/2007 | Chen | |
| 2007/0081332 A1 * | 4/2007 | He | 362/252 |
| 2007/0123957 A1 * | 5/2007 | Friedman et al. | 607/88 |
| 2008/0048200 A1 | 2/2008 | Mueller et al. | |
| 2008/0225523 A1 * | 9/2008 | De Samber et al. | 362/249 |
| 2009/0032295 A1 * | 2/2009 | Okajima et al. | 174/260 |
| 2009/0118800 A1 * | 5/2009 | Deisseroth et al. | 607/92 |
| 2009/0179207 A1 | 7/2009 | Chitnis et al. | |
| 2010/0083912 A1 * | 4/2010 | Hurwitz | 119/792 |
| 2010/0142215 A1 * | 6/2010 | Waring | 362/473 |
| 2010/0214799 A1 * | 8/2010 | Ohmi et al. | 362/545 |
| 2010/0277666 A1 * | 11/2010 | Bertram et al. | 349/61 |
| 2010/0295070 A1 | 11/2010 | Su et al. | |
| 2010/0295077 A1 | 11/2010 | Melman | |
| 2011/0018017 A1 | 1/2011 | Bierhuizen et al. | |
| 2011/0050381 A1 | 3/2011 | Olson | |
| 2011/0051413 A1 | 3/2011 | Hand | |
| 2011/0085336 A1 | 4/2011 | Blumel et al. | |
| 2011/0180818 A1 * | 7/2011 | Lerman et al. | 257/88 |
| 2011/0204391 A1 * | 8/2011 | Lerman et al. | 257/88 |
| 2011/0278049 A1 * | 11/2011 | Kim et al. | 174/254 |
| 2011/0286222 A1 * | 11/2011 | Coleman | 362/326 |
| 2012/0036750 A1 * | 2/2012 | Ryul | 40/546 |
| 2012/0057099 A1 * | 3/2012 | Tanuma et al. | 349/62 |
| 2012/0097985 A1 | 4/2012 | Liu et al. | |
| 2012/0120667 A1 | 5/2012 | Schenkl | |
| 2012/0165759 A1 * | 6/2012 | Rogers et al. | 604/264 |
| 2012/0182755 A1 * | 7/2012 | Wildner | 362/555 |
| 2012/0201104 A1 * | 8/2012 | Amenduni Gresele | 368/239 |
| 2012/0205697 A1 | 8/2012 | Kim et al. | |
| 2013/0027906 A1 | 1/2013 | Ueda et al. | |
| 2013/0092421 A1 * | 4/2013 | Kajiya | 174/252 |
| 2013/0155674 A1 | 6/2013 | Park et al. | |
| 2013/0313983 A1 * | 11/2013 | Radermacher | 315/187 |
| 2014/0001496 A1 | 1/2014 | Musser et al. | |
| 2014/0003053 A1 | 1/2014 | Musser et al. | |
| 2014/0043810 A1 | 2/2014 | Jo et al. | |
| 2015/0016123 A1 | 1/2015 | Musser et al. | |

OTHER PUBLICATIONS

EE Times.com-"Wireless Beacon Could Recharge Consumer Devices", by R. Colin Johnson, 3 pages, Nov. 6, 2007.

"Novel Zero-Voltage and Zero-Current Switching (ZVZCS) Full-Bridge PWM Converter Using Coupled Output Inductor", Sep. 2002 IEEE, pp. 641-648.

"New Architectures for Radio Frequency dc/dc Power Conversion", Juan Rivas et al.,Laboratory for Electromagnetic and Electronic Systems, Massachusetts Institute of Technology, Room 10-171 Cambridge, MA 02139, pp. 4074-4084.

"Electronic Transformer for a 12V Halogen Lamp", 1999, ST Microelectronics pp. 1-4.

* cited by examiner

USE OF FLEXIBLE CIRCUITS INCORPORATING A HEAT SPREADING LAYER AND THE RIGIDIZING SPECIFIC AREAS WITHIN SUCH A CONSTRUCTION BY CREATING STIFFENING STRUCTURES WITHIN SAID CIRCUITS BY EITHER FOLDING, BENDING, FORMING OR COMBINATIONS THEREOF

CROSS-REFERENCE TO RELATED APPLICATION(S)

This application claims priority under 35 U.S.C. §119(e) of the U.S. Provisional Patent Application Ser. No. 61/597,619, filed Feb. 10, 2012 and titled, "THE USE OF FLEXIBLE CIRCUITS INCORPORATING A HEAT SPREADING LAYER AND THE RIGIDIZING SPECIFIC AREAS WITHIN SUCH A CONSTRUCTION BY CREATING STIFFENING STRUCTURES WITHIN SAID CIRCUITS BY EITHER FOLDING, BENDING, FORMING OR COMBINATIONS THEREOF," which is also hereby incorporated by reference in its entirety for all purposes.

FIELD OF THE INVENTION

The present invention relates to the field of LED fabrication. More specifically, the present invention relates to LED constructions.

BACKGROUND OF THE INVENTION

The use of LEDs in lighting applications presents many advantages with regards to energy conservation and less maintenance. While LEDs produce less waste heat per lumen than other sources, the waste heat that is produced is concentrated in a small area. As the efficiency and life expectancy of LEDs drops dramatically with increased operating temperature, it is preferred that these components operate at a lower feasible temperature. Circuits used to power LEDs typically have oversize traces and a heat-spreading layer on the opposite side of the traces. Typically the heat spreading layer is insulated from the power traces by an interposing dielectric layer that is designed to have favorable thermal communication while maintaining some minimum required dielectric strength.

The typical LED circuitry is either built on a flexible printed circuit (FPC) and bonded to thick, rigid aluminum heat sinks. Other typical LED circuitry is built on metal-clad PC board material such as Bergquist T-Clad®. The use of thick aluminum heat sinks, such as 1,000 micrometers, and metal-clad PC board material add cost and weight to the LED units. The thick aluminum heat sinks and metal-clad PC board material also make the LED assembly rigid and not flexible.

SUMMARY OF THE INVENTION

In some aspects of the present invention, a LED assembly comprises a laminated structure with copper power traces on the top side with an interposing dielectric composite between a bottom heat spreading layer. The LED assembly disclosed herein is advantageous in many aspects including that it has a sufficiently flexible and thin structure, such that it can be manufactured using a roll-to-roll process. The use of thin materials reduces the energy needed for manufacturing it and reduces the weight and energy needed to carry the LED assembly, which are important considerations when making energy conservative devices. Further, regionally rigid structures can be created by folding, bending, and/or forming the flexible laminated structure.

In some embodiments of the present invention, the LED assembly comprises a flexible structure, which allows the LED assembly to be folded, bent, and/or formed while it contains specific stiff areas within the LED assembly to form a regionally rigid structure, such as a horseshoe structure and/or a stair step structure. In some embodiments, the material used to make the LED assembly further enhances the cooling efficiency (such as heat conductivity and thermal emissivity) of the assembly.

In an aspect, a method of making an electronic assembly comprises making a regionally stiffening structure by changing a shape a flexible heat dissipating laminate, wherein the flexible heat dissipating laminate comprises a conducting layer, a dielectric layer, and a heat spreading layer. In some embodiments, the method further comprises coupling a LED chip with the conducting layer. In other embodiments, the method further comprises making a horseshoe structure by bending both terminal ends of the flexible heat dissipating laminate toward a same direction. In some other embodiments, the method further comprises making a hook structure on either or both of the terminal ends of the flexible heat dissipating laminate. In some embodiments, the method further comprises making a stair step structure by bending terminal ends of the flexible heat dissipating laminate toward different directions. In other embodiments, the method further comprises making a hook structure on either or both of the terminal ends of the flexible heat dissipating laminate. In some other embodiments, the method further comprises a hook structure. In some embodiments, the heat spreading layer comprises a metallic layer. In other embodiments, the metallic layer comprises aluminum. In some other embodiments, the metallic layer comprises copper. In some embodiments, the heat spreading layer has a thickness in a range between 90 micrometers and 150 micrometers. In other embodiments, the heat spreading layer having a thickness less than 500 micrometers. In some other embodiments, the dielectric layer comprises polyimide. In other embodiments, the conducting layer comprises copper.

In another aspect, a LED assembly comprises a locally rigid structure having an angled flexible heat dissipating laminate, wherein the angled flexible heat dissipating laminate comprises a conducting layer, a dielectric layer, and a heat spreading layer having a thickness less than 500 micrometers, an electrical circuitry on the conducting layer, and a LED die electrically coupled with the electrical circuitry. In some embodiments, the heat spreading layer has a thickness in the range between 100 micrometers and 150 micrometers. In other embodiments, the locally rigid structure comprises a horseshoe structure. In some other embodiments, the locally rigid structure comprises a stair step structure. In some embodiments, the locally rigid structure comprises a hook structure. In other embodiments, the heat spreading layer comprises a metallic layer. In some other embodiments, the heat spreading layer comprises an aluminum layer. In some embodiments, the heat spreading layer comprises a copper layer.

In another aspect, a method of making a flexible LED assembly comprises using a roll-to-roll process to form a laminate structure, wherein the laminate structure comprises a conducting layer, a dielectric layer, and a heat spreader layer having a thickness within 500 micrometers and making an electric circuitry on the laminate structure. In some embodiments, the method further comprises coupling a LED die to the electrical circuitry. In other embodiments, the method further comprises storing the laminate structure in a reel form. In some other embodiments, the method further comprises snug-fitting the flexible LED assembly to a non-planner base of an automobile. In some embodiments, the method further comprises making a regionally rigid structure by bending the laminate structure.

In another aspect, a thermal emissivity enhanced LED assembly comprises a heat spreading layer thermally coupled with a dielectric layer, an electrical conducting layer coupled with the dielectric layer, a LED electrically coupled with the electrical conducting layer, and a thermal emissive material having a thermal emissivity higher than the heat spreading layer coupled with the heat spreading layer. In some embodiments, the thermal emissive material with the heat spreading layer comprises a greater heat emitting area than the heat spreading layer of a typical LED construction. In other embodiments, the thermal emissive material increases the thermal emissivity when compared with the thermal emissivity of the heat spreading layer alone such that the total emissivity increases by at least 6 times. In some other embodiments, the electrical conducting layer comprises copper. In some embodiments, the copper has a thickness in a range between 9 micrometers and 140 micrometers. In other embodiments, the heat spreading layer has a thickness in a range between 12 micrometers and 250 micrometers. In some other embodiments, the dielectric layer has a thickness in a range between 5 micrometers and 75 micrometers. In some embodiments, thermal emissivity enhanced LED has a value of thermal emissivity greater than 0.6. In other embodiments, the heat spreading layer comprises aluminum. In some other embodiments, the heat spreading layer comprises copper.

BRIEF DESCRIPTION OF THE DRAWINGS

Embodiments are now described by way of examples, with reference to the accompanying drawings which are meant to be exemplary and not limiting. For all figures mentioned herein, like numbered elements refer to like elements throughout.

DETAILED DESCRIPTION OF THE PREFERRED EMBODIMENT

Figure 1:
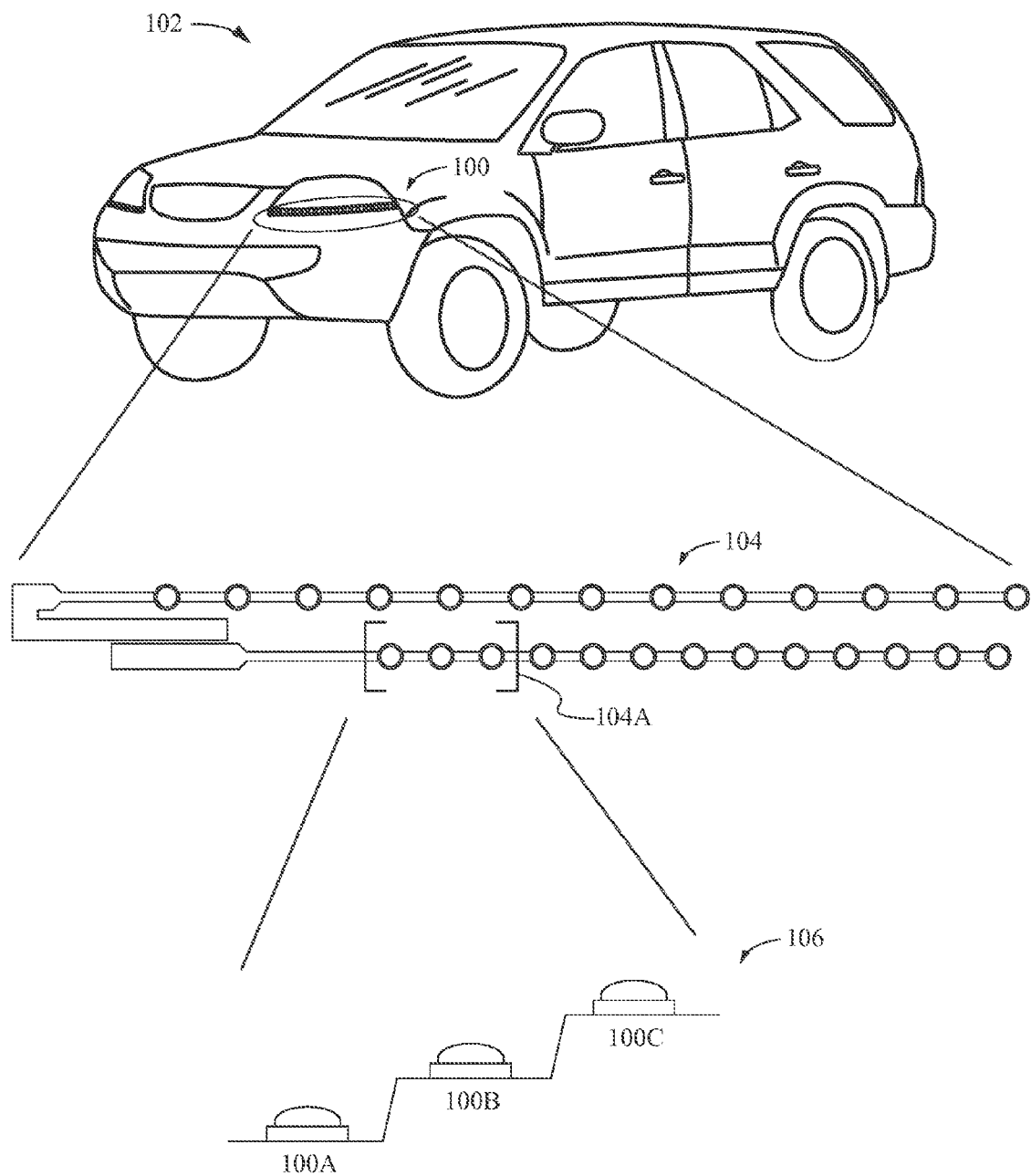
FIG. 1 illustrates a LED assembly used on an automobile in accordance with some embodiments of the present invention.

FIG. 1 illustrates a LED assembly 100 used on an automobile 102 in accordance with some embodiments of the present invention. Modern automobiles use LED to replace traditional light bulb for energy saving, light weight, and better illumination. A light panel 104 on the automobile 102 contains the LEDs 100 that are arranged on a non-planner surface such that the LEDs 100 can focus on different spots and have different illuminating effects. For example, the view 106 is a side cross-sectional view of 104A of the light panel 104. In view 106, the LED 100C is at a vertical position higher than the LED 100B, and the LED 100B is at a vertical position that is higher than the LED 100A. With the flexible and bendable structure of the LED assembly 100 disclosed herein, the LEDs 100 are able to be applied on various surfaces and for various applications.

Figure 2:
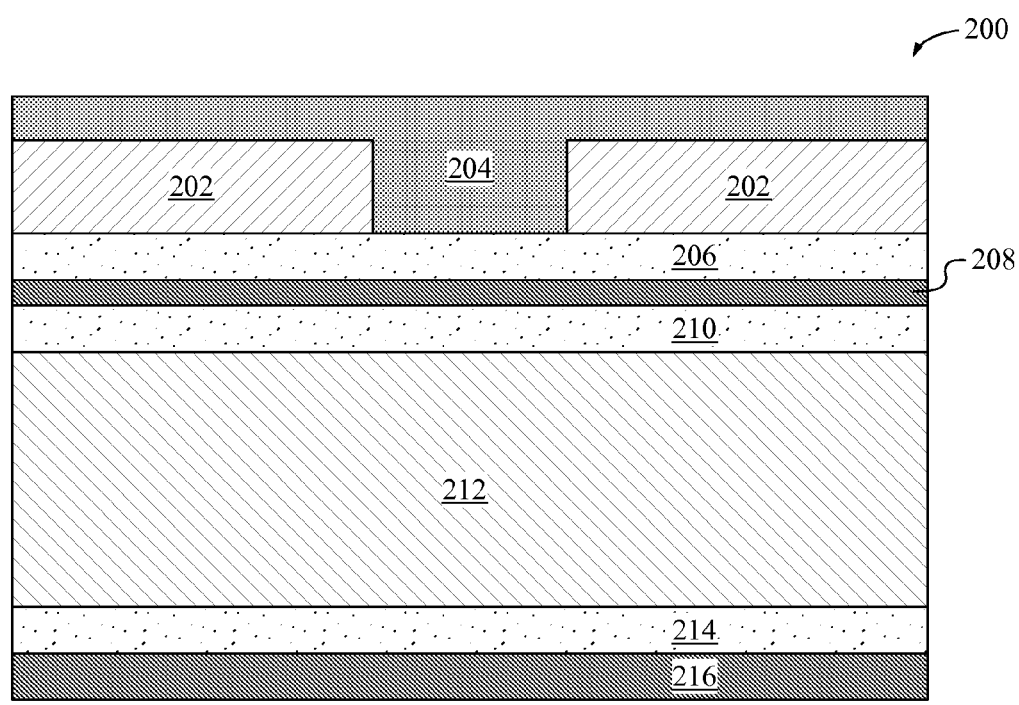
FIG. 2 illustrates a LED laminate base structure in accordance with some embodiments of the present invention.

FIG. 2 illustrates a LED laminate base structure 200 in accordance with some embodiments of the present invention. The LED laminate base structure 200 comprises a covercoat 204 on top of a portion of the copper trace 202. A first thermal conductive adhesive layer 206 couples with the copper trace 202 and/or the covercoat 204. A polyimide layer 208 is underneath the first thermal conductive adhesive layer 206. In some embodiments, the polyimide layer 208 comprise Kapton®. The polyimide layer 208 sandwiched by a second thermal conductive adhesive layer 210. In some embodiments, the first, the second, or both of thermal conductive adhesive layers comprise an adhesive A523, which is able to be an epoxy adhesive. A heat spreading layer (e.g. a heat sink) 212 couples with the second thermal conductive adhesive layer 210.

In some embodiments, the first thermal conductive adhesive layer 206 and the second thermal conductive adhesive layer 210 each comprises a layer of adhesive A523 having a thickness of 18 micrometers. The polyimide layer 208 comprises a layer of Kapton® having a thickness of 12 micrometers. The heat spreading layer 212 comprise a heat conductive material, such as aluminum, having a thickness 100 micrometers, which is 1/10 of the thickness of a typical heat sink in a typical LED assembly. In some embodiments, the thickness of the heat spreading layer 212 is between 100-150 micrometers. In some other embodiments, the thickness of the heat spreading layer 212 is less than 500 micrometers. Optionally, an adhesive layer 214 with a thickness of 18 micrometers of a heat conductive adhesive A523 couples to the bottom of the heat spreader layer 212. Another polyimide layer 216 having a thickness of 12 micrometers can be optionally coupled with the adhesive layer 214. Having the adhesive layer 214 and the polyimide layer 216 can make heat emission and dissipation more efficiently.

Figure 3:
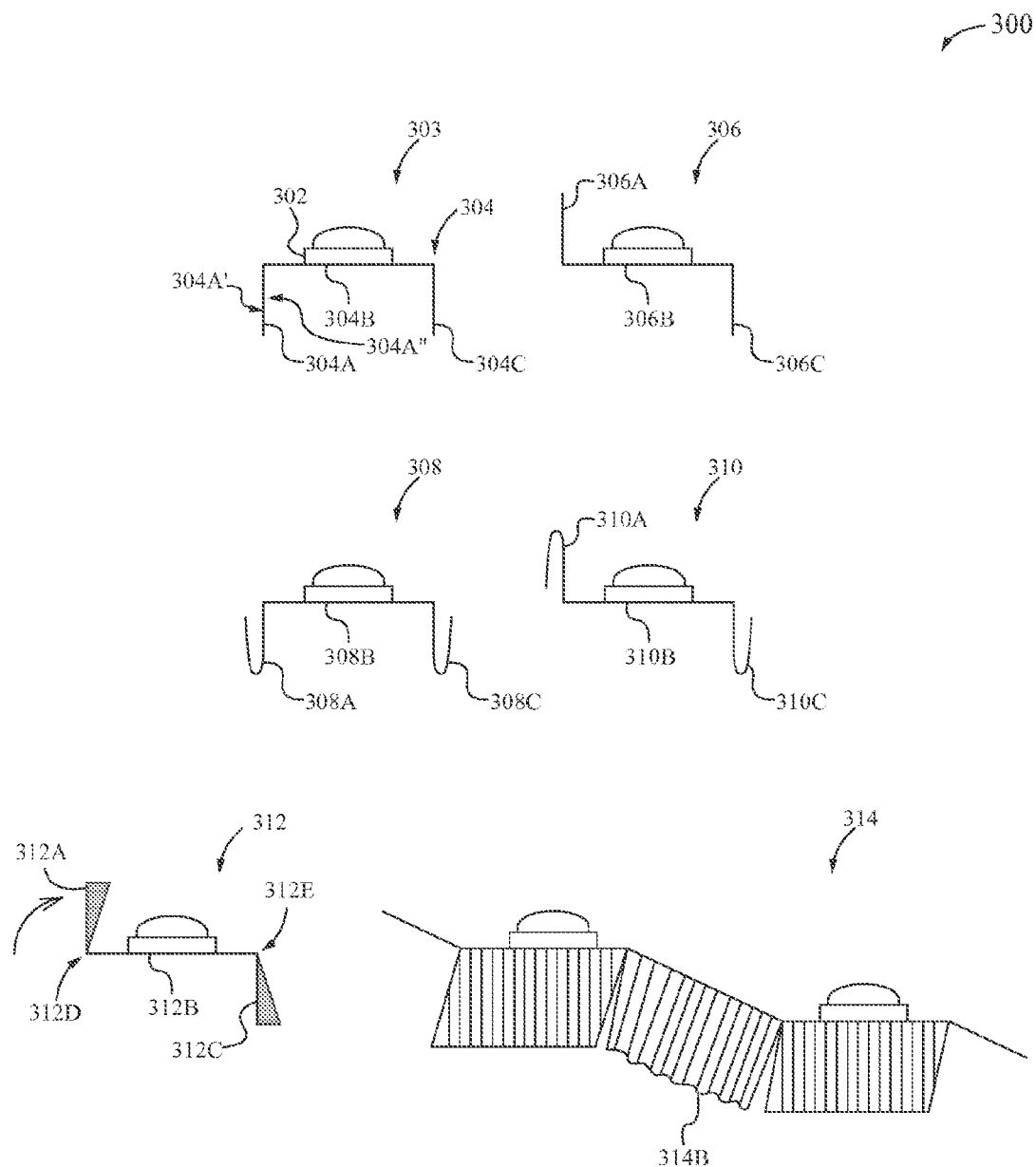
FIG. 3 illustrates some LED assemblies in bending modes in accordance with some embodiments of the present invention.

FIG. 3 illustrates some LED assembly 300 in accordance with some embodiments of the present invention. As illustrated below, the LED assembly 300 forms a regionally rigid structure by bending and/or folding a flexible LED laminate base structure (such as the LED laminate base structure 200 of FIG. 2) to form an angled structured, such as a horseshoe structure and a stair step structure.

Still referring to FIG. 3, a LED assembly 303 comprises a LED die containing unit 302 on a LED laminate base structure 304. In some embodiments, the LED laminate base structure 304 comprises the LED laminate base structure 200 (FIG. 2). The LED laminate base structure 304 comprises a left section 304A, middle section 304B, and right section 304C. The middle section 304B thermally couples with the LED containing unit 302. In some embodiments, the middle section 304B electrically couples with the LED containing unit 302. In some other embodiments, the middle section 304B is electrically isolated from the LED containing unit 302. The left section 304A and the right section 304C are bending downward making a LED upward pointing structure. The LED assembly 306 contains a LED laminate base structure having a left section 306A, middle section 306B, and right section 306C. The left section 306A is bending upward and the right section is bending downward making a stair step structure. The LED assembly 308 contains a LED laminate base structure having hooks. The left section 308A and the right section 308C both comprise a hook structure, so that a structure strength/thickness of both left section 308A and right section 308C are reinforced. In some embodiments, the hook structure of the LED assembly 308 is able to hook on another supporting structure, such as a loop structure. The LED assembly 310 comprises a left section 310A, middle section 310B, and the right section 310C, wherein the left and right sections comprise hooks. The left section 310A is bending upward and the right section 310C is bending downward, so that the LED assembly 310 forms a stair step structure with hooks on each side. The LED assembly 312 comprise a left section 312A, middle section 312B, and right section 312C. Crease lines 312D and 312E are form by folding, bending, crushing, or pressing the left section 312A and/or the right section 312C. A LED assembly 314 comprises a LED laminate base structure having a corrugated structure 314B. The LED assembly disclosed herein is thin and flexible to be bent in various geometries and is sufficiently stiff to hold the structure as bended. In some embodiments, the LED assembly having the LED die 302 is stiff and rigid such that it cannot be bent. In some embodiments, any part of the LED assembly (such as 304A and 304C) having the LED laminate base structures without the LED die 302 is flexible and is able to be freely bent and folded, such as at the point 304A' and/or at the point 304A".

Figure 4:
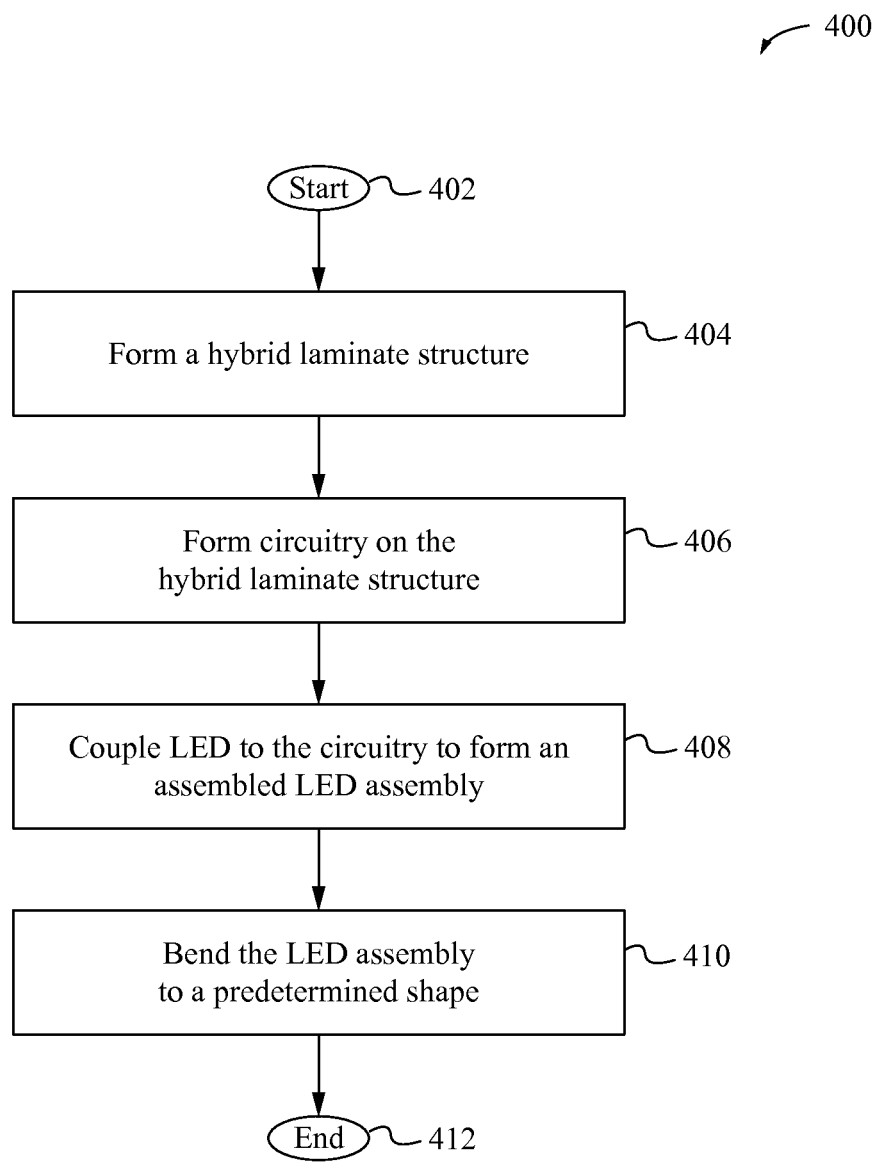
FIG. 4 illustrates a method of making the LED assembly in accordance with some embodiments of the present invention.

FIG. 4 illustrates a method 400 of making the LED assembly in accordance with some embodiments of the present invention. The method can start from Step 402. At Step 404, a hybrid laminate structure is formed. The making of the hybrid laminate structure can be done by using a typical roll-to-roll process. The hybrid laminate structure comprises a conducting layer attached to an interposing dielectric layer. The dielectric layer is attached to a bottom heat spreading layer, which is generally made by a metallic material, such as aluminum, having a thickness between 100-150 micrometers. At Step 406, a circuitry is created on the hybrid laminate structure. The circuitry, such as electronic circuit patterns, are formed using a photolithography process. For example, a masking film that is sensitive to UV light is applied over the copper side of the laminate. The copper side of the laminate is then exposed to UV using masking artwork. The UV degrades or hardens the masking film in the exposed areas depending on the chemistry used. The mask is then running through a chemical bath to develop the image. Next, the mask is removed to etch away the unwanted copper at an etching line, such that wanted traces are produced.

At Step 408, LED chips are attached to the circuitry at a pre-determined location to form an assembled LED assembly. At Step 410, the LED assembly is bent to a pre-determined shape to enhance the selected regional rigidity for further application, such as installing on a headlight of an automobile. The method stops at Step 412.

The heat spreading layer of the LED assembly disclosed herein is advantageous in many ways, such as having a lower thermal resistivity and higher thermal emissivity. The lower thermal resistivity and higher thermal emissivity are able to be achieved by incorporating additional layers of heat conductive material (such as coupling heat conductive adhesive A523 and polyimide with the bottom of the heat spreading layer, e.g., aluminum heat spreading layer) and increasing heat emitting areas when compared with the typical heat sink of the typical LED assembly.

For example, in a typical heat sink of a typical LED assembly having a vertical construction of 1 oz copper, 18 micrometers adhesive A523, 25 micrometers polyimide, 50 micrometers PSA (pressure sensitive adhesive), and 1 mm (1000 micrometers) aluminum, the thermal resistivity is 465 $C\text{-}mm^2/Watt$.

In some embodiments of the present invention, the heat spreading layer of the LED assembly having a construction of 1 oz copper, 18 micrometers adhesive A523, 12 micron polyimide, 18 micrometers adhesive A523, 100 micrometers aluminum, 18 micron heat conductive A523, and 12 micrometer polyimide, the thermal resistivity is 240 $C\text{-}mm^2/Watt$. In some embodiments, the thermal resistivity of the dielectric layer can be as low as 96 $C\text{-}mm^2/Watt$. In some embodiments of the present invention, the total thermal emission of the heat spreading layer can be 6 to 13 times better than a typical heat sink plate of a typical LED assembly.

In some embodiments of the present invention, the heat spreading layer can be manufactured by using a standard sheet metal fabrication procedure to generate three-dimensional beam structures from planar sheets to generate heat spreaders of greater rigidity and improved thermal performance. The methods disclosed herein allows LED assembly to be manufactured on specific FPC materials that can be mass produced on a roll-to-roll equipment. After the LED assembly is manufactured, it can be bent and/or formed into relatively rigid structures, which allows to be manufactured in a fully automated assembly process.

In some embodiments of the present invention, the methods can be used on any flexible to semi-flexible laminate having a top conducting layer (e.g., copper) with an interposing dielectric layer and a metallic bottom heat spreading layer, such as a copper or aluminum layer. In some embodiments, the laminates are standard double sided flexible printed circuit (FPC) laminates and bendable thermally conductive laminates. The standard double sided flexible printed circuit (FPC) laminates and bendable thermally conductive laminates are described in U.S. Pat. Nos. 8,071,882 and 5,776,740, which are incorporated by references in their entirety for all purposes.

In some embodiments, the term "forming" comprising having a sheet of the laminate to be pressed by a die with a protrusion to make a dimple on the laminate such that a structural strength is created/enhanced with the creation of the dimple. In some embodiments, the term "forming" comprises the action of pressing a sheet of a material, such as the laminate, that is performed by a person skill in the art in the automobile manufacturing industry. The actions of forming, bending, and folding are able to be performed separately and/or together.

The roll-to-roll process comprises a process of creating electronic devices on a roll of flexible plastic or metal foil, which includes any process of applying coatings, printing, or performing other processes starting with a roll of a flexible material and re-reeling after the process to create an output roll. Once the rolls of material have been coated, laminated or printed, they can be slitted to their finished size on a slitter rewinder.

The LED assembly can be utilized in various fields, such as lightings for automobile, houses, and streets. In operation, the manufacturing process can fabricate LED assemblies on FPC materials having a top circuitry layer attached to an interposing dielectric layer. The dielectric layer is attached to a bottom metallic heat spreading layer. The circuit assembly can be completed in a planar form. The LED assembly can be populated in a planar form and then bent and/or formed into relatively rigid structures. Alternatively, the LED assembly can be first bent and/or form into relatively rigid structures and then populated. In both cases, the areas around the pads of the populated components are not deformed and retain their planar format.

The present invention has been described in terms of specific embodiments incorporating details to facilitate the understanding of principles of construction and operation of the invention. Such reference herein to specific embodiments and details thereof is not intended to limit the scope of the claims appended hereto. It is readily apparent to one skilled in the art that other various modifications can be made in the embodiment chosen for illustration without departing from the spirit and scope of the invention as defined by the claims.

What is claimed is:

1. A method of constructing an electronic assembly comprising making a regionally stiffening structure by changing a shape of a flexible heat dissipating laminate, wherein the flexible heat dissipating laminate comprises a conducting layer, a dielectric layer, a heat spreading layer, a first end and a second end opposite the first end, wherein the each of the heat spreading layer, the dielectric layer and the electrical conducting layer extend from the first end to the second end, and wherein a LED is positioned above the electrical conducting layer, the dielectric layer and the heat spreading layer.

2. The method of claim 1, wherein the making comprises bending.

3. The method of claim 1, wherein the making comprises folding.

4. The method of claim 1, wherein the making comprises forming.

5. The method of claim 1 further comprising coupling the LED chip with the conducting layer.

6. The method of claim 1 further comprising making a horseshoe structure by bending terminal ends of the flexible heat dissipating laminate toward a same direction.

7. The method of claim 6 further comprising making a hook structure on either or both of the terminal ends of the flexible heat dissipating laminate.

8. The method of claim 1 further comprising making a stair step structure by bending terminal ends of the flexible heat dissipating laminate toward different directions.

9. The method of claim 8 further comprising making a hook structure on either or both of the terminal ends of the flexible heat dissipating laminate.

10. The method of claim 1 further comprising a hook structure.

11. The method of claim 1, wherein the heat spreading layer comprises a metallic layer.

12. The method of claim 11, wherein the metallic layer comprises aluminum.

13. The method of claim 12, wherein the metallic layer comprises copper.

14. The method of claim 1, wherein the heat spreading layer has a thickness in a range between 90 micrometers and 150 micrometers.

15. The method of claim 1, wherein the heat spreading layer having a thickness less than 500 micrometers.

16. The method of claim 1, wherein the dielectric layer comprises polyimide.

17. The method of claim 1, wherein the conducting layer comprises copper.

18. A LED assembly comprising:
   a. a locally rigid structure having an angled flexible heat dissipating laminate, wherein the angled flexible heat dissipating laminate comprises a conducting layer, a dielectric layer, a heat spreading layer having a thickness less than 500 micrometers, a first end and a second end opposite the first end, wherein each of the heat spreading layer, the dielectric layer and the conducting layer extends from the first end to the second end;
   b. an electrical circuitry on the conducting layer; and
   c. a LED die electrically coupled with the electrical circuitry such that the LED die is positioned above the electrical conducting layer, the dielectric layer and the heat spreading layer.

19. The LED assembly of claim 18, wherein the heat spreading layer has a thickness in the range between 100 micrometers and 150 micrometers.

20. The LED assembly of claim 18, wherein the locally rigid structure comprises a horseshoe structure.

21. The LED assembly of claim 18, wherein the locally rigid structure comprises a stair step structure.

22. The LED assembly of claim 18, wherein the locally rigid structure comprises a hook structure.

23. The LED assembly of claim 18, wherein the heat spreading layer comprises a metallic layer.

24. The LED assembly of claim 18, wherein the heat spreading layer comprises an aluminum layer.

25. The LED assembly of claim 18, wherein the heat spreading layer comprises a copper layer.

26. A method of making a flexible LED assembly comprising:
   a. using a roll-to-roll process to form a laminate structure, wherein the laminate structure comprises a conducting layer, a dielectric layer, a heat spreader layer having a thickness within 500 micrometers, a first end and a second end opposite the first end, wherein each of the heat spreading layer, the dielectric layer and the conducting layer extends from the first end to the second end;
   b. making an electric circuitry on the laminate structure; and
   c. coupling a LED die to the electrical circuitry such that the LED die is positioned above the electrical conducting layer, the dielectric layer and the heat spreading layer.

27. The method of claim 26 further comprising storing the laminate structure in a reel form.

28. The method of claim 26 further comprising snug-fitting the flexible LED assembly to a non-planner base of an automobile.

29. The method of claim 26 further comprising making a regionally rigid structure by bending the laminate structure.

30. A thermal emissivity enhanced LED assembly comprising:
   a. a heat spreading layer thermally coupled with a dielectric layer;
   b. an electrical conducting layer coupled with the dielectric layer;
   c. a LED electrically coupled with the electrical conducting layer;
   d. a thermal emissive material having a thermal emissivity higher than the heat spreading layer coupled with the heat spreading layer; and
   e. a first end and a second end opposite the first end, wherein each of the heat spreading layer, the dielectric layer and the electrical conducting layer extends from the first end to the second end, and wherein the LED is positioned above the electrical conducting layer, the dielectric layer and the heat spreading layer.

31. The thermal emissivity enhanced LED assembly of claim 30, wherein the thermal emissive material with the heat spreading layer comprises a greater heat emitting area than the heat spreading layer alone.

32. The thermal emissivity enhanced LED assembly of claim 30, wherein the electrical conducting layer comprises copper.

33. The thermal emissivity enhanced LED assembly of claim 32, wherein the copper has a thickness in a range between 9 micrometers and 140 micrometers.

34. The thermal emissivity enhanced LED assembly of claim 33, wherein the heat spreading layer has a thickness in a range between 12 micrometers and 250 micrometers.

35. The thermal emissivity enhanced LED assembly of claim 34, wherein the dielectric layer has a thickness in a range between 5 micrometers and 75 micrometers.

36. The thermal emissivity enhanced LED assembly of claim 35, wherein thermal emissivity enhanced LED has a value of thermal emissivity greater than 0.6.

37. The thermal emissivity enhanced LED assembly of claim 30, wherein the heat spreading layer is sandwiched between the thermal emissive material and the dielectric layer, and wherein the thermal emissive material covers the entirety of a surface of the heat spreading layer such that the surface of the heat spreading layer is not exposed.

38. The thermal emissivity enhanced LED assembly of claim 37, further comprising an overcoat on top of at least a portion of electrical circuitry and on top of at least a portion of the electrical conducting layer.

* * * * *